United States Patent
Wang et al.

(10) Patent No.: US 11,631,589 B2
(45) Date of Patent: Apr. 18, 2023

(54) METAL ETCH IN HIGH ASPECT-RATIO FEATURES

(71) Applicant: Applied Materials, Inc., Santa Clara, CA (US)

(72) Inventors: Baiwei Wang, Milpitas, CA (US); Xiaolin C. Chen, San Ramon, CA (US); Rohan Puligoru Reddy, San Jose, CA (US); Oliver Jan, Fremont, CA (US); Zhenjiang Cui, San Jose, CA (US); Anchuan Wang, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 17/307,636

(22) Filed: May 4, 2021

(65) Prior Publication Data
US 2022/0359214 A1 Nov. 10, 2022

(51) Int. Cl.
*H01L 21/3065* (2006.01)
*H01L 27/1157* (2017.01)
*H01J 37/305* (2006.01)

(52) U.S. Cl.
CPC ...... *H01L 21/3065* (2013.01); *H01J 37/3053* (2013.01); *H01L 27/1157* (2013.01); *H01J 2237/334* (2013.01)

(58) Field of Classification Search
None
See application file for complete search history.

(56) References Cited

U.S. PATENT DOCUMENTS

| | | | | |
|---|---|---|---|---|
| 5,989,929 A | * | 11/1999 | Nikoh | H01J 37/3299 156/345.24 |
| 6,010,966 A | * | 1/2000 | Ionov | H01L 21/32136 438/719 |
| 10,283,369 B2 | | 5/2019 | Clark et al. | |
| 11,062,921 B1 | * | 7/2021 | Cui | H01L 21/67069 |
| 11,121,002 B2 | * | 9/2021 | Cui | H01L 21/31122 |
| 2012/0238103 A1 | | 9/2012 | Zhang et al. | |
| 2014/0154889 A1 | | 6/2014 | Wang et al. | |

(Continued)

FOREIGN PATENT DOCUMENTS

| | | |
|---|---|---|
| TW | 202117802 A | 5/2021 |
| WO | 2018226594 A1 | 12/2018 |

OTHER PUBLICATIONS

Application No. PCT/US2022/024040, International Search Report and Written Opinion, dated Jul. 27, 2022, 12 pages.

*Primary Examiner* — Allan W. Olsen
(74) *Attorney, Agent, or Firm* — Kilpatrick Townsend & Stockton LLP

(57) ABSTRACT

Exemplary methods of etching may include flowing a fluorine-containing precursor and a secondary gas into a processing region of a semiconductor processing chamber. The secondary gas may be or include oxygen or nitrogen. A flow rate ratio of the fluorine-containing precursor to the secondary gas may be greater than or about 1:1. The methods may include contacting a substrate with the fluorine-containing precursor and the secondary gas. The substrate may include an exposed metal. The substrate may define a high aspect-ratio structure. The methods may include etching the exposed metal within the high aspect-ratio structure.

18 Claims, 5 Drawing Sheets

(56) References Cited

U.S. PATENT DOCUMENTS

| | | | | |
|---|---|---|---|---|
| 2014/0179111 A1* | 6/2014 | Liu | .................. | H01J 37/32357 |
| | | | | 438/720 |
| 2016/0314985 A1* | 10/2016 | Yang | ................. | H01J 37/32926 |
| 2017/0069511 A1* | 3/2017 | Yang | .................. | H01L 21/0234 |
| 2017/0365487 A1* | 12/2017 | Shen | ................. | H01L 27/11582 |
| 2018/0350617 A1* | 12/2018 | Chen | ..................... | H01L 21/306 |
| 2018/0374863 A1 | 12/2018 | Purayath | | |
| 2019/0067032 A1* | 2/2019 | Shinoda | ............ | H01L 21/67115 |
| 2019/0214230 A1* | 7/2019 | Cui | ................... | H01J 37/32972 |
| 2020/0013628 A1* | 1/2020 | Chen | ................ | H01L 21/67069 |
| 2021/0242030 A1* | 8/2021 | Shinoda | ............ | H01J 37/32449 |

* cited by examiner

US 11,631,589 B2

METAL ETCH IN HIGH ASPECT-RATIO FEATURES

TECHNICAL FIELD

The present technology relates to semiconductor processes and equipment. More specifically, the present technology relates to etching within high-aspect ratio features.

BACKGROUND

Integrated circuits are made possible by processes which produce intricately patterned material layers on substrate surfaces. Producing patterned material on a substrate requires controlled methods for removal of exposed material. Chemical etching is used for a variety of purposes including transferring a pattern in photoresist into underlying layers, thinning layers, or thinning lateral dimensions of features already present on the surface. Often it is desirable to have an etch process that etches one material faster than another facilitating, for example, a pattern transfer process. Such an etch process is said to be selective to the first material. As a result of the diversity of materials, circuits, and processes, etch processes have been developed with a selectivity towards a variety of materials.

Etch processes may be termed wet or dry based on the materials used in the process. A wet HF etch preferentially removes silicon oxide over other dielectrics and materials. However, wet processes may have difficulty penetrating some constrained trenches and also may sometimes deform the remaining material. Dry etches produced in local plasmas formed within the substrate processing region can penetrate more constrained trenches and exhibit less deformation of delicate remaining structures. However, local plasmas may damage the substrate through the production of electric arcs as they discharge.

Thus, there is a need for improved systems and methods that can be used to produce high quality devices and structures. These and other needs are addressed by the present technology.

SUMMARY

Exemplary methods of etching may include flowing a fluorine-containing precursor and a secondary gas into a processing region of a semiconductor processing chamber. The secondary gas may be or include oxygen or nitrogen. A flow rate ratio of the fluorine-containing precursor to the secondary gas may be greater than or about 1:1. The methods may include contacting a substrate with the fluorine-containing precursor and the secondary gas. The substrate may include an exposed metal. The substrate may define a high aspect-ratio structure. The methods may include etching the exposed metal within the high aspect-ratio structure.

In some embodiments, the methods may include forming a plasma of the fluorine-containing precursor and the secondary gas. A temperature within the processing region may be maintained at less than or about 500° C. The high aspect-ratio structure may be or include a memory hole in a 3D NAND structure. The exposed metal may extend laterally into recesses formed perpendicular to the memory hole. The methods may include, subsequent etching the exposed metal, purging the processing region of the semiconductor processing chamber. The methods may include forming a plasma of an oxygen-containing precursor. The methods may include contacting the exposed metal with plasma effluents of the oxygen-containing precursor to produce oxidized metal. The fluorine-containing precursor may be a first fluorine-containing precursor. The methods may include flowing a second fluorine-containing precursor into processing region. The methods may include contacting the oxidized metal with the second fluorine-containing precursor. The processing region may be maintained plasma free while contacting the oxidized metal with the second fluorine-containing precursor. The method may be performed at a chamber operating pressure of between about 1 Torr and about 50 Torr. The methods may include, subsequent etching the exposed metal, flowing a chlorine-containing precursor into the processing region. The chlorine-containing precursor may scavenge residual fluorine. A top-to-bottom loading value may be less than or about 1.5 subsequent etching the exposed metal within the high aspect-ratio structure.

Some embodiments of the present technology may encompass methods of etching. The methods may include flowing a first fluorine-containing precursor and a secondary gas into a processing region of a semiconductor processing chamber. The methods may include contacting a substrate with the first fluorine-containing precursor and the secondary gas. The substrate may include an exposed metal. The substrate may define a memory hole in a 3D NAND structure. The exposed metal may extend laterally into recesses formed perpendicular to the memory hole. The methods may include etching the exposed metal within the memory hole. The methods may include forming a plasma of an oxygen-containing precursor. The methods may include contacting the exposed metal with plasma effluents of the oxygen-containing precursor to produce oxidized metal. The methods may include flowing a second fluorine-containing precursor into the processing region of the semiconductor processing chamber. The methods may include removing the oxidized metal.

In some embodiments, the secondary gas may include oxygen or nitrogen. A flow rate ratio of the first fluorine-containing precursor to the secondary gas may be greater than or about 1:1. The methods may include forming a plasma of the first fluorine-containing precursor and the secondary gas. A temperature within the semiconductor processing chamber may be maintained between about 200° C. and about 500° C. A pressure within the semiconductor processing chamber may be maintained between about 1 Torr and about 50 Torr. The processing region may be maintained plasma free while flowing a second fluorine-containing precursor into the processing region of the semiconductor processing chamber. The methods may include, subsequent etching the exposed metal, flowing a chlorine-containing precursor into the processing region. The chlorine-containing precursor may scavenge residual fluorine from the exposed metal.

Some embodiments of the present technology may encompass methods of etching. The methods may include flowing a first fluorine-containing precursor and a secondary gas into a processing region of a semiconductor processing chamber. The secondary gas may include oxygen or nitrogen. The methods may include contacting a substrate with the first fluorine-containing precursor and the secondary gas. The substrate may include an exposed metal, and the substrate may define a high aspect-ratio structure. The methods may include etching the exposed metal within the high aspect-ratio structure. The methods may include contacting the exposed metal with an oxygen-containing precursor to produce oxidized metal. The methods may include flowing a second fluorine-containing precursor into the processing region of the semiconductor processing chamber. The methods may include removing the oxidized metal. The method may be performed with a chamber operating temperature of less than or about 500° C.

Such technology may provide numerous benefits over conventional systems and techniques. For example, the processes may allow metal to be removed from high aspect-ratio features. Additionally, the processes may afford a range of sidewall profiles during the etch processes being performed. These and other embodiments, along with many of their advantages and features, are described in more detail in conjunction with the below description and attached figures.

BRIEF DESCRIPTION OF THE DRAWINGS

A further understanding of the nature and advantages of the disclosed technology may be realized by reference to the remaining portions of the specification and the drawings.

Figure 1:
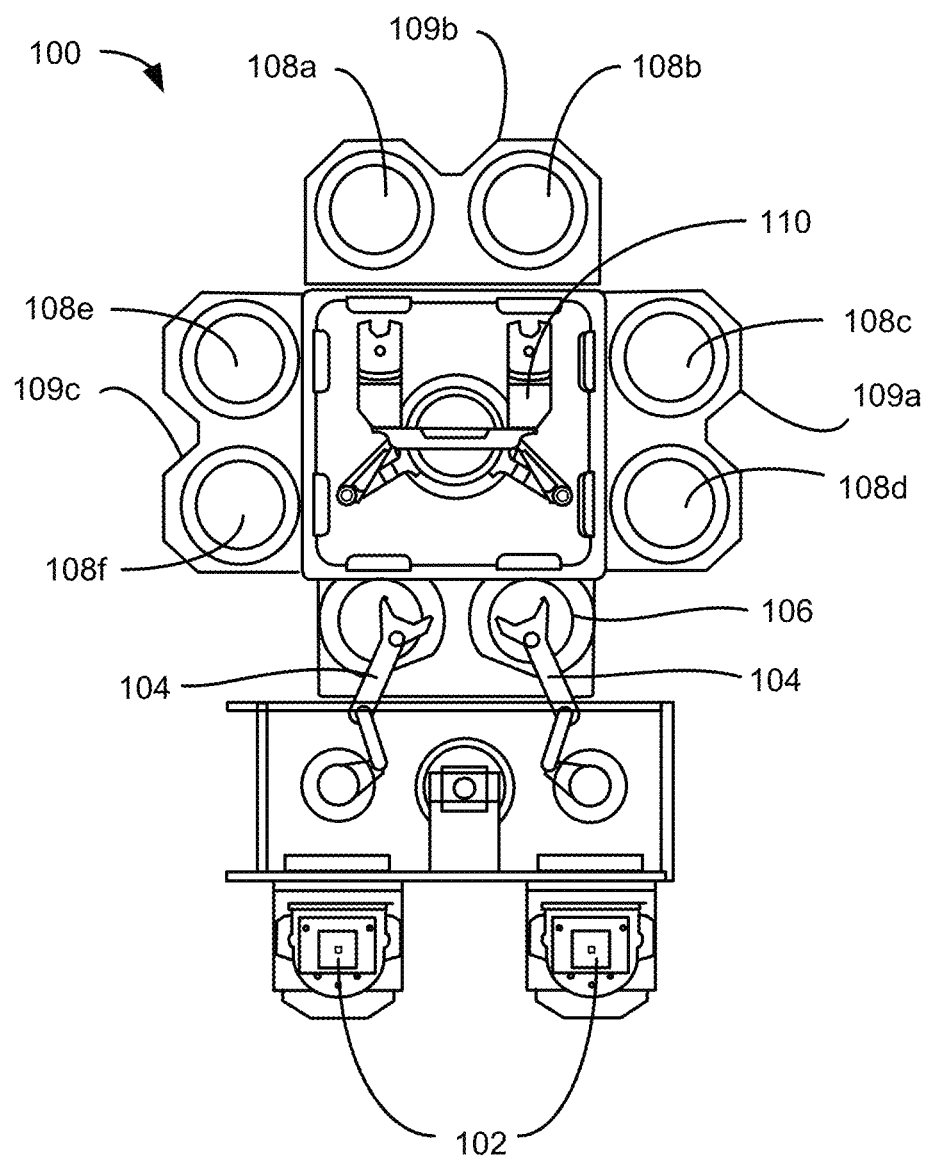
FIG. 1 shows a top plan view of one embodiment of an exemplary processing system according to some embodiments of the present technology.

Several of the figures are included as schematics. It is to be understood that the figures are for illustrative purposes, and are not to be considered of scale unless specifically stated to be of scale. Additionally, as schematics, the figures are provided to aid comprehension and may not include all aspects or information compared to realistic representations, and may include exaggerated material for illustrative purposes.

In the appended figures, similar components and/or features may have the same reference label. Further, various components of the same type may be distinguished by following the reference label by a letter that distinguishes among the similar components. If only the first reference label is used in the specification, the description is applicable to any one of the similar components having the same first reference label irrespective of the letter.

DETAILED DESCRIPTION

In transitioning from 2D NAND to 3D NAND, many process operations are modified from vertical to horizontal operations. Additionally, as 3D NAND structures grow in the number of cells being formed, the aspect ratios of memory holes and other structures increase, sometimes dramatically. During 3D NAND processing, stacks of placeholder layers and dielectric materials may form the inter-electrode dielectric or IPD layers. These placeholder layers may have a variety of operations performed to place structures before fully removing the material and replacing it with metal. Metallization may be performed in which a metal is formed along the structure and between layers of dielectric as portions of the memory cells. The metal may extend along sidewalls of the memory holes and within recessed portions, and a subsequent etch may be performed to separate the individual cells within the memory hole structure.

Many conventional technologies utilize etching processes to produce these structures that may be incapable of adequately performing at future process nodes. For example, as the number of cells within a structure increases to hundreds of cells, memory holes may be formed to a depth of several microns. Because of the robust etching of wet etches, the wet etch may begin etching the features closer to the top of the structure well before the bottom of the structure has been accessed by the etchant. Additionally, wet etching of small form factor structures may cause pattern collapse or deformation due to surface tension of the etchant. Using wet etchants may also create the need for subsequent operations to remove residues formed within the trenches or holes. Dry etching techniques may also be performed, however similar loading issues may occur. For example, because of the time needed to access deep within the trench, etching may already be occurring nearer the top of the structure. A ratio of the amount of metal etched at the top of the structure compared to an amount etched at the bottom of the structure, known as the top-to-bottom loading value, may be greater than or about 4 in some cases. Accordingly, top features may be over etched prior to etch completion or cell separation nearer the bottom of the structure.

The present technology overcomes these issues by performing a dry etch process that may allow control of the top-to-bottom loading value by incorporating a protective gas with the etchant being used. The protective gas may occupy sites across the metal to be etched, which may limit or reduce etching nearer the top of the structure while the etchants are penetrating the high aspect-ratio structure. This may allow a tunable etch profile to be formed along the structure, and which may provide additional control over etching that may increase uniformity of the process regardless of the depth of the structure.

Although the remaining disclosure will routinely identify specific etching processes utilizing the disclosed technology, it will be readily understood that the systems and methods are equally applicable to deposition and cleaning processes as may occur in the described chambers. Accordingly, the technology should not be considered to be so limited as for use with etching processes or chambers alone. Moreover, although an exemplary chamber is described to provide foundation for the present technology, it is to be understood that the present technology can be applied to virtually any semiconductor processing chamber that may allow the operations described.

FIG. 1 shows a top plan view of one embodiment of a processing system 100 of deposition, etching, baking, and curing chambers according to embodiments. In the figure, a pair of front opening unified pods 102 supply substrates of a variety of sizes that are received by robotic arms 104 and placed into a low pressure holding area 106 before being placed into one of the substrate processing chambers 108a-f, positioned in tandem sections 109a-c. A second robotic arm 110 may be used to transport the substrate wafers from the holding area 106 to the substrate processing chambers 108a-f and back. Each substrate processing chamber 108a-f, can be outfitted to perform a number of substrate processing operations including the dry etch processes described herein in addition to cyclical layer deposition, atomic layer deposition, chemical vapor deposition, physical vapor deposition, etch, pre-clean, degas, orientation, and other substrate processes.

The substrate processing chambers 108a-f may include one or more system components for depositing, annealing, curing and/or etching a dielectric film on the substrate wafer. In one configuration, two pairs of the processing chambers, e.g., 108c-d and 108e-f, may be used to deposit dielectric material on the substrate, and the third pair of processing chambers, e.g., 108a-b, may be used to etch the deposited dielectric. In another configuration, all three pairs of chambers, e.g., 108a-f, may be configured to etch a dielectric film on the substrate. Any one or more of the processes described may be carried out in one or more chambers separated from the fabrication system shown in different embodiments. It will be appreciated that additional configurations of deposition, etching, annealing, and curing chambers for dielectric films are contemplated by system 100.

Figure 2A:
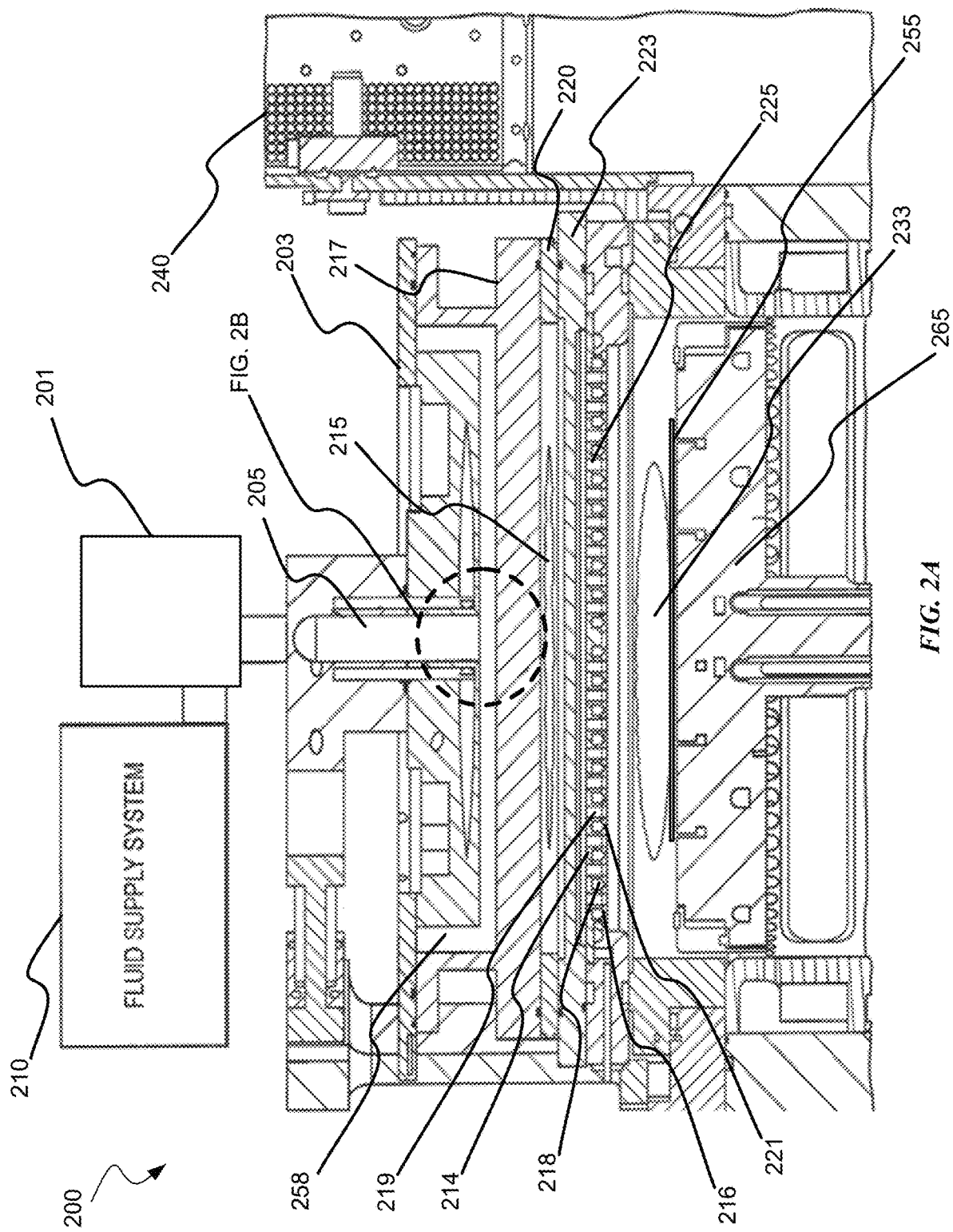
FIG. 2A shows a schematic cross-sectional view of an exemplary processing chamber according to some embodiments of the present technology.

FIG. 2A shows a cross-sectional view of an exemplary process chamber system 200 with partitioned plasma generation regions within the processing chamber, and which may be configured to perform processes as described further below. During film etching, such as including titanium nitride, tantalum nitride, tungsten, silicon, polysilicon, silicon oxide, silicon nitride, silicon oxynitride, silicon oxycarbide, or other materials, a process gas may be flowed into the first plasma region 215 through a gas inlet assembly 205. A remote plasma system 201 may optionally be included in the system, and may process a first gas which then travels through gas inlet assembly 205. The inlet assembly 205 may include two or more distinct gas supply channels where the second channel may bypass the remote plasma system unit 201, if included.

A cooling plate 203, faceplate 217, ion suppressor 223, showerhead 225, and a substrate support 265, having a substrate 255 disposed thereon, are shown and may each be included according to embodiments. The pedestal 265 may have a heat exchange channel through which a heat exchange fluid flows to control the temperature of the substrate, which may be operated to heat and/or cool the substrate or wafer during processing operations. The wafer support platter of the pedestal 265, which may comprise aluminum, ceramic, or a combination thereof, may also be resistively heated in order to achieve relatively high temperatures, such as from up to or about 100° C. to above or about 1100° C., using an embedded resistive heater element.

The faceplate 217 may be pyramidal, conical, or of another similar structure with a narrow top portion expanding to a wide bottom portion. The faceplate 217 may additionally be flat as shown and include a plurality of through-channels used to distribute process gases. Plasma generating gases and/or plasma excited species, depending on use of the RPS 201, may pass through a plurality of holes, shown in FIG. 2B, in faceplate 217 for a more uniform delivery into the first plasma region 215.

Exemplary configurations may include having the gas inlet assembly 205 open into a gas supply region 258 partitioned from the first plasma region 215 by faceplate 217 so that the gases/species flow through the holes in the faceplate 217 into the first plasma region 215. Structural and operational features may be selected to prevent significant backflow of plasma from the first plasma region 215 back into the supply region 258, gas inlet assembly 205, and fluid supply system 210. The faceplate 217, or a conductive top portion of the chamber, and showerhead 225 are shown with an insulating ring 220 located between the features, which allows an AC potential to be applied to the faceplate 217 relative to showerhead 225 and/or ion suppressor 223. The insulating ring 220 may be positioned between the faceplate 217 and the showerhead 225 and/or ion suppressor 223 enabling a capacitively-coupled plasma to be formed in the first plasma region. A baffle may additionally be located in the first plasma region 215, or otherwise coupled with gas inlet assembly 205, to affect the flow of fluid into the region through gas inlet assembly 205. In some embodiments, additional plasma sources may be utilized including inductively-coupled plasma sources extending about the chamber or in fluid communication with the chamber, as well as additional plasma-generating systems.

The ion suppressor 223 may comprise a plate or other geometry that defines a plurality of apertures throughout the structure that are configured to suppress the migration of ionically-charged species out of the first plasma region 215 while allowing uncharged neutral or radical species to pass through the ion suppressor 223 into an activated gas delivery region between the suppressor and the showerhead. In embodiments, the ion suppressor 223 may comprise a perforated plate with a variety of aperture configurations. These uncharged species may include highly reactive species that are transported with less reactive carrier gas through the apertures. As noted above, the migration of ionic species through the holes may be reduced, and in some instances completely suppressed. Controlling the amount of ionic species passing through the ion suppressor 223 may advantageously provide increased control over the gas mixture brought into contact with the underlying wafer substrate, which in turn may increase control of the deposition and/or etch characteristics of the gas mixture. For example, adjustments in the ion concentration of the gas mixture can significantly alter its etch selectivity, e.g., SiNx:SiOx etch ratios, Si:SiOx etch ratios, etc. In alternative embodiments in which deposition is performed, it can also shift the balance of conformal-to-flowable style depositions for dielectric materials.

The plurality of apertures in the ion suppressor 223 may be configured to control the passage of the activated gas, i.e., the ionic, radical, and/or neutral species, through the ion suppressor 223. For example, the aspect ratio of the holes, or the hole diameter to length, and/or the geometry of the holes may be controlled so that the flow of ionically-charged species in the activated gas passing through the ion suppressor 223 is reduced. The holes in the ion suppressor 223 may include a tapered portion that faces the plasma excitation region 215, and a cylindrical portion that faces the showerhead 225. The cylindrical portion may be shaped and dimensioned to control the flow of ionic species passing to the showerhead 225. An adjustable electrical bias may also be applied to the ion suppressor 223 as an additional means to control the flow of ionic species through the suppressor.

The ion suppressor 223 may function to reduce or eliminate the amount of ionically charged species traveling from the plasma generation region to the substrate. Uncharged neutral and radical species may still pass through the openings in the ion suppressor to react with the substrate. It should be noted that the complete elimination of ionically charged species in the reaction region surrounding the substrate may not be performed in embodiments. In certain instances, ionic species are intended to reach the substrate in order to perform the etch and/or deposition process. In these instances, the ion suppressor may help to control the concentration of ionic species in the reaction region at a level that assists the process.

Showerhead 225 in combination with ion suppressor 223 may allow a plasma present in first plasma region 215 to avoid directly exciting gases in substrate processing region 233, while still allowing excited species to travel from chamber plasma region 215 into substrate processing region 233. In this way, the chamber may be configured to prevent the plasma from contacting a substrate 255 being etched. This may advantageously protect a variety of intricate structures and films patterned on the substrate, which may be damaged, dislocated, or otherwise warped if directly contacted by a generated plasma. Additionally, when plasma is allowed to contact the substrate or approach the substrate level, the rate at which oxide species etch may increase. Accordingly, if an exposed region of material is oxide, this material may be further protected by maintaining the plasma remotely from the substrate.

The processing system may further include a power supply 240 electrically coupled with the processing chamber to provide electric power to the faceplate 217, ion suppressor 223, showerhead 225, and/or pedestal 265 to generate a plasma in the first plasma region 215 or processing region 233. The power supply may be configured to deliver an adjustable amount of power to the chamber depending on the process performed. Such a configuration may allow for a tunable plasma to be used in the processes being performed. Unlike a remote plasma unit, which is often presented with on or off functionality, a tunable plasma may be configured to deliver a specific amount of power to the plasma region 215. This in turn may allow development of particular plasma characteristics such that precursors may be dissociated in specific ways to enhance the etching profiles produced by these precursors.

A plasma may be ignited either in chamber plasma region 215 above showerhead 225 or substrate processing region 233 below showerhead 225. Plasma may be present in chamber plasma region 215 to produce the radical precursors from an inflow of, for example, a fluorine-containing precursor or other precursor. An AC voltage typically in the radio frequency ("RF") range may be applied between the conductive top portion of the processing chamber, such as faceplate 217, and showerhead 225 and/or ion suppressor 223 to ignite a plasma in chamber plasma region 215 during deposition. An RF power supply may generate a high RF frequency of 13.56 MHz but may also generate other frequencies alone or in combination with the 13.56 MHz frequency.

Figure 2B:
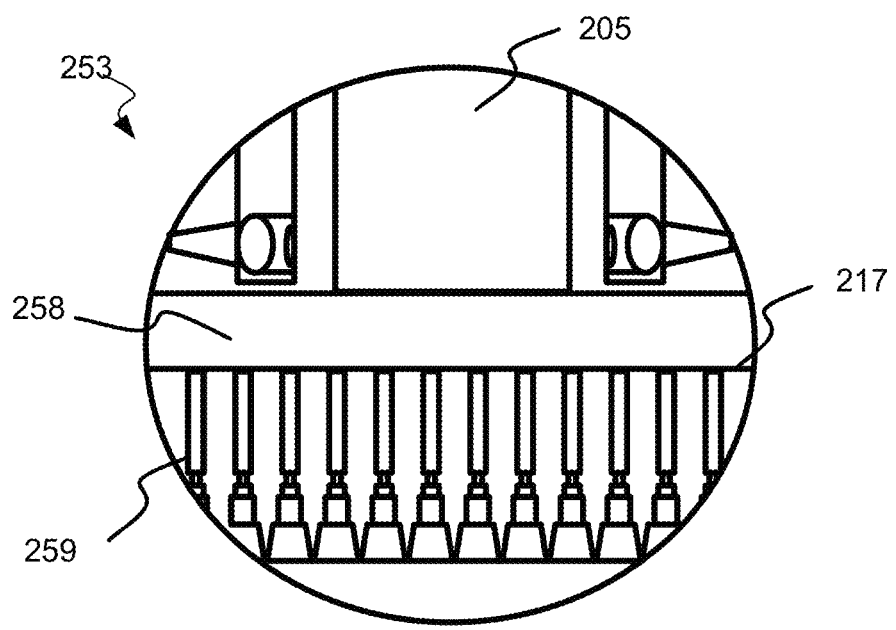
FIG. 2B shows a detailed view of a portion of the processing chamber illustrated in FIG. 2A according to some embodiments of the present technology.

FIG. 2B shows a detailed view 253 of the features affecting the processing gas distribution through faceplate 217. As shown in FIGS. 2A and 2B, faceplate 217, cooling plate 203, and gas inlet assembly 205 intersect to define a gas supply region 258 into which process gases may be delivered from gas inlet 205. The gases may fill the gas supply region 258 and flow to first plasma region 215 through apertures 259 in faceplate 217. The apertures 259 may be configured to direct flow in a substantially unidirectional manner such that process gases may flow into processing region 233, but may be partially or fully prevented from backflow into the gas supply region 258 after traversing the faceplate 217.

Figure 3:
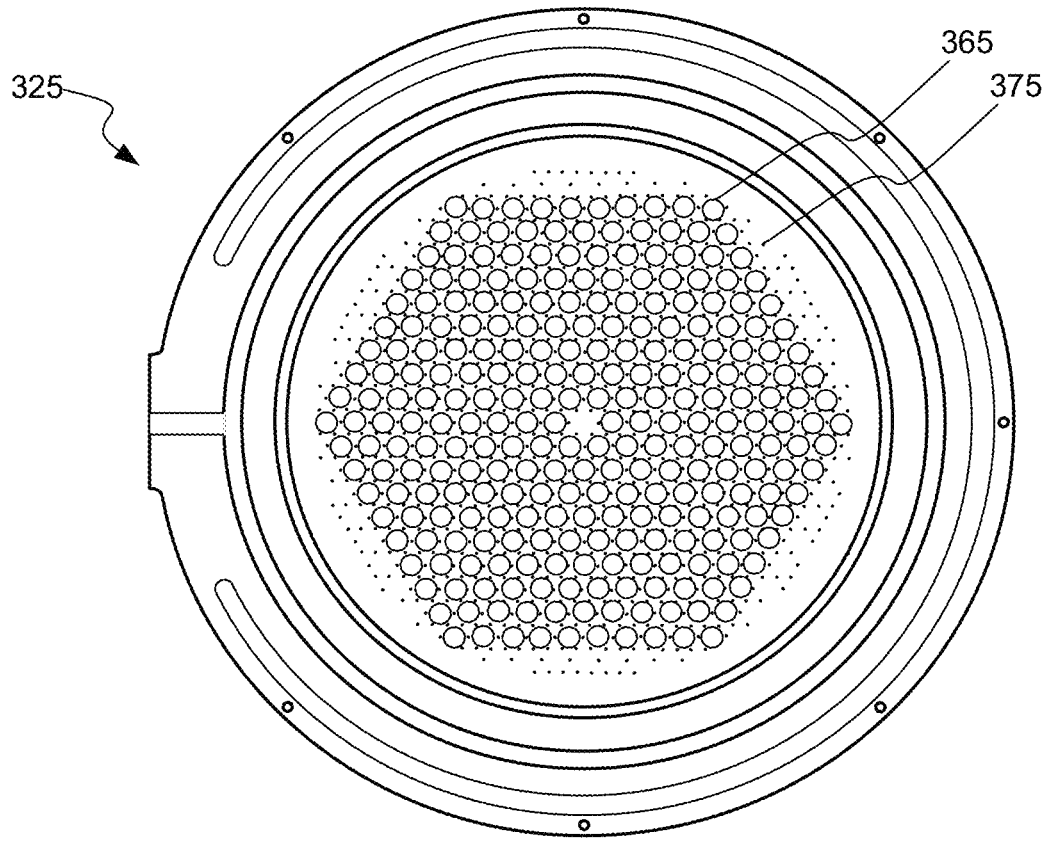
FIG. 3 shows a bottom plan view of an exemplary showerhead according to some embodiments of the present technology.

The gas distribution assemblies such as showerhead 225 for use in the processing chamber section 200 may be referred to as dual channel showerheads and are additionally detailed in the embodiments described in FIG. 3. The dual channel showerhead may provide for etching processes that allow for separation of etchants outside of the processing region 233 to provide limited interaction with chamber components and each other prior to being delivered into the processing region.

The showerhead 225 may comprise an upper plate 214 and a lower plate 216. The plates may be coupled with one another to define a volume 218 between the plates. The coupling of the plates may be so as to provide first fluid channels 219 through the upper and lower plates, and second fluid channels 221 through the lower plate 216. The formed channels may be configured to provide fluid access from the volume 218 through the lower plate 216 via second fluid channels 221 alone, and the first fluid channels 219 may be fluidly isolated from the volume 218 between the plates and the second fluid channels 221. The volume 218 may be fluidly accessible through a side of the gas distribution assembly 225.

FIG. 3 is a bottom view of a showerhead 325 for use with a processing chamber according to embodiments. Showerhead 325 may correspond with the showerhead 225 shown in FIG. 2A. Through-holes 365, which show a view of first fluid channels 219, may have a plurality of shapes and configurations in order to control and affect the flow of precursors through the showerhead 225. Small holes 375, which show a view of second fluid channels 221, may be distributed substantially evenly over the surface of the showerhead, even amongst the through-holes 365, and may help to provide more even mixing of the precursors as they exit the showerhead than other configurations.

Figure 4:
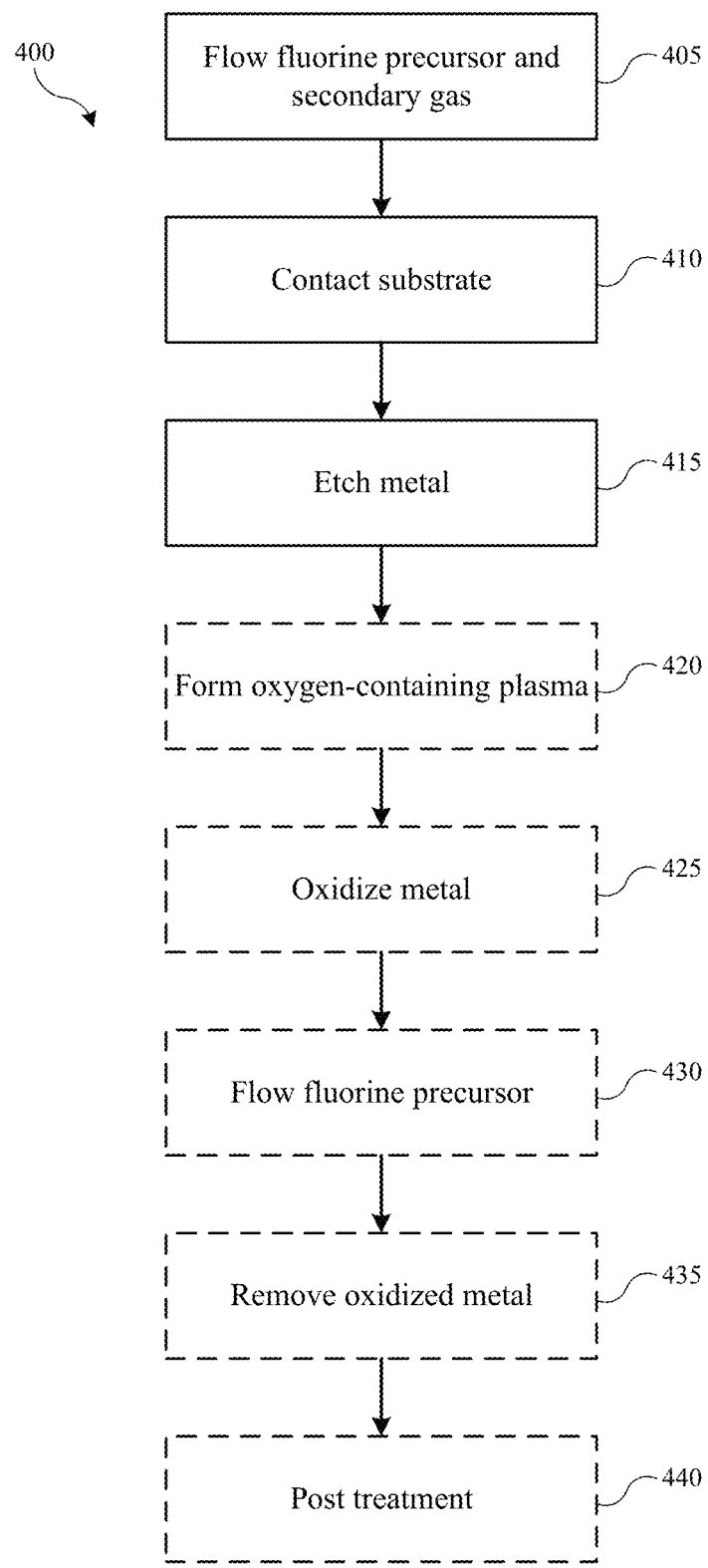
FIG. 4 shows exemplary operations in a method according to some embodiments of the present technology.

The chamber discussed previously may be used in performing exemplary methods, including etching methods, although any number of chambers may be configured to perform one or more aspects used in embodiments of the present technology. Turning to FIG. 4 is shown exemplary operations in a method 400 according to embodiments of the present technology. Method 400 may include one or more operations prior to the initiation of the method, including front end processing, deposition, etching, polishing, cleaning, or any other operations that may be performed prior to the described operations. The methods may include a number of optional operations, which may or may not be specifically associated with some embodiments of methods according to embodiments of the present technology. For example, many of the operations are described in order to provide a broader scope of the processes performed, but are not critical to the technology, or may be performed by alternative methodology as will be discussed further below. Method 400 may describe operations shown schematically in FIGS. 5A-5C, the illustrations of which will be described in conjunction with the operations of method 400. It is to be understood that the figures illustrate only partial schematic views, and a substrate may contain any number of additional materials and features having a variety of characteristics and aspects as illustrated in the figures.

Figure 5A:
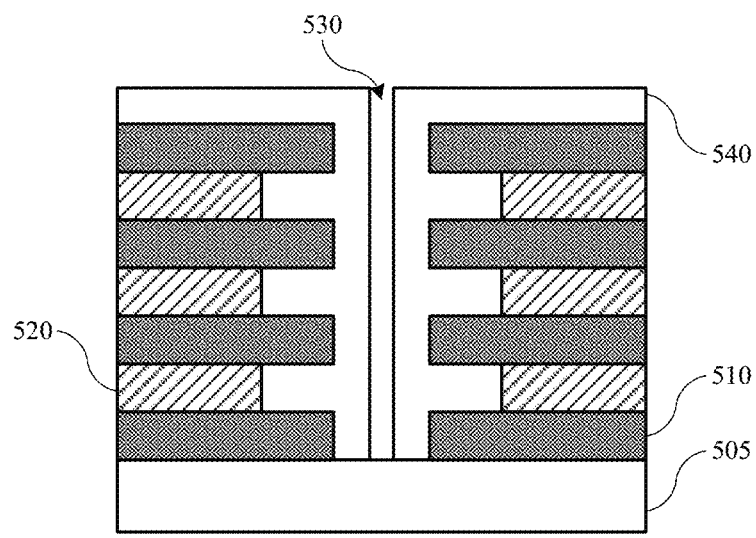
FIGS. 5A-5C show cross-sectional views of substrates being processed according to some embodiments of the present technology.

Method 400 may or may not involve optional operations to develop the semiconductor structure to a particular fabrication operation. It is to be understood that method 400 may be performed on any number of semiconductor structures or substrates 505, as illustrated in FIG. 5A, including exemplary structures on which a metal material removal operation may be performed. As illustrated in FIG. 5A substrate 505 may have a plurality of stacked layers overlying the substrate, which may be silicon, silicon germanium, or other substrate materials. The layers may include IPD layers including dielectric material 510, which may be silicon oxide, in alternating layers with placeholder material 520, which may be silicon nitride or polysilicon, for example. Placeholder material 520 may be or include material that will be removed to produce individual memory cells in subsequent operations. Although illustrated with only 7 layers of material, exemplary structures may include any of the numbers of layers including hundreds of layers of material, and it is to be understood that the figures are only schematics to illustrate aspects of the present technology. Trench 530, which may be a memory hole or aperture, may be defined through the stacked structure to the level of substrate 505. Trench 530 may be defined by sidewalls that may be composed of the alternating layers of dielectric material 510 and placeholder material 520. For example, the sidewalls may be a radius of the aperture or memory hole. Although only a single memory hole structure is illustrated, it is to be understood that exemplary substrates may include any number of memory structures across a substrate.

After recesses may be formed within the placeholder materials, a metal material 540 may be formed or deposited on the structure. Metal 540 may extend about the structure and within the memory holes and each recess formed in the placeholder materials as illustrated. The metal may be molybdenum, tungsten, or a number of other metals as may be used in 3D NAND or other semiconductor structures. The substrate may then be seated within a processing chamber, such as chamber 200 described above, and method 400 may be performed for etching the metal within the high aspect-ratio feature. For example, features according to the present technology may be characterized by any aspect ratios or the height-to-width ratio of the structure, although in some embodiments the materials may be characterized by larger aspect ratios, which may not allow sufficient etching utilizing conventional technology or methodology as discussed above. For example, in some embodiments the aspect ratio of an exemplary structure, such as a memory hole as a non-limiting example, may be greater than or about 10:1, greater than or about 20:1, greater than or about 30:1, greater than or about 40:1, greater than or about 50:1, greater than or about 100:1, or greater.

Figure 5B:
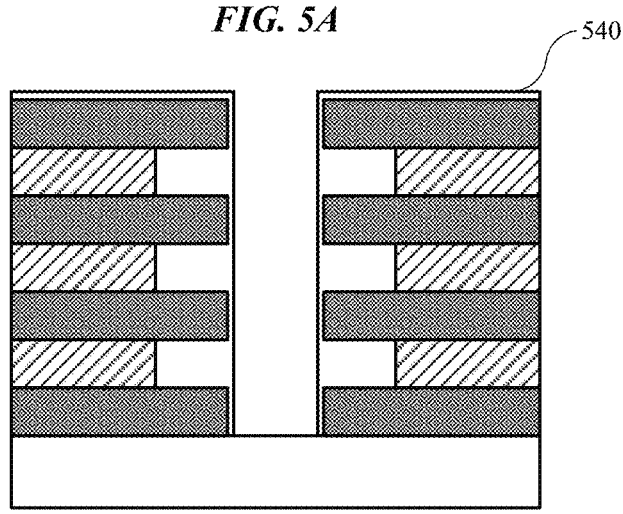

Method 400 may be performed to etch or otherwise remove portions of the metal 540, which may separate the metal into the recessed portions of the structure as illustrated. The method may be performed to facilitate control of the profile through the structure, and improve etch characteristics, such as surface smoothness of the metal within the recessed sections of the structure. For example, method 400 may include flowing a fluorine-containing precursor and a secondary gas, such as a protective gas, into a processing region of the chamber in which the substrate is maintained at operation 405. The fluorine-containing precursor and the secondary gas may contact the substrate at operation 410, and etch the metal within the high aspect-ratio structure at operation 415. As illustrated in FIG. 5B, metal 540 may be recessed within the trench along sidewalls of the memory hole, as well as along a top surface across the structure. While conventional technologies may create a top-to-bottom loading that may resemble a V-shaped profile, where more material is etched at the top of the structure as discussed above, the present technology may afford a substantially or essentially straight profile, as well as an inverted V-shaped profile, where the material further into the structure may be etched more than material at the top of the structure, which may allow the formation of a range of top-to-bottom loading values.

To provide this control, the present technology may utilize a secondary gas that may help limit or reduce etching or etch rates at the top of the structure. For example, the fluorine-containing precursor and the secondary gas may access the metal 540 along an exterior top surface into which the memory hole is formed prior to contacting metal within the feature. Without the secondary gas, which may be a protective gas, the etching may begin at the top of the structure long before the etching may begin nearer the bottom of the structure. However, by incorporating a secondary gas, the secondary gas molecules may occupy surface area or sites along the metal 540, which may reduce etch rates. For example, although fluorine may continue to bond with the metal at discreet locations, these locations may be at least partially blocked by the secondary gas. Exemplary metals, such as molybdenum or tungsten, may not have one-to-one removal characteristics with fluorine, and instead, three, four, or six fluorine atoms may be incorporated prior to removal of the metal atoms. Accordingly, by utilizing the protective gas, these interactions between the fluorine and the metal may be controlled, reduced, or limited, which may facilitate control of the etch rate.

However, as the flow rate ratio of the secondary gas increases relative to the fluorine-containing precursor, the etch rate may continue to reduce, and eventually the secondary gas molecules will interrupt the etch process at each location, preventing further etch. Accordingly, in some embodiments a flow rate ratio of the fluorine-containing precursor to the secondary gas may be maintained greater than or about 1:1, which may ensure an amount of etch proceeds at the top of the structure. For example, the flow rate ratio of the fluorine-containing precursor to the secondary gas may be maintained at greater than or about 1.2:1, and may be maintained at greater than or about 1.4:1, greater than or about 1.6:1, greater than or about 1.8:1, greater than or about 2.0:1, greater than or about 2.2:1, greater than or about 2.4:1, greater than or about 2.6:1, greater than or about 2.8:1, greater than or about 3.0:1, greater than or about 4.0:1, greater than or about 5.0:1, greater than or about 6.0:1, greater than or about 7.0:1, greater than or about 8.0:1, greater than or about 9.0:1, greater than or about 10.0:1, or greater. Additionally, a first flow rate ratio may be used, and may be adjusted as the etch process proceeds to a second flow rate ratio different from the first as the etch process proceeds. Any of the noted ratios, or any ratio encompassed within the ranges listed may be used for either the first flow rate ratio or the second flow rate ratio in some embodiments during the flowing operations.

In some embodiments, the fluorine-containing precursor and/or the secondary gas may be plasma enhanced prior to contacting the metal on the substrate. The plasma may be formed in a remote region of the processing chamber, or may be formed locally. Although a substrate-level plasma may be produced, in some embodiments the plasma may be a remote plasma, which may protect exposed substrate materials from ion bombardment that may occur due to the substrate-level plasma. Whether plasma-enhanced or not, the materials may contact the metal 540, at the top of the structure and then may flow through the structure into the memory holes. The etch process may continue until the metal is removed towards the recesses extending laterally and perpendicular to a direction of the memory hole. Although the process may be continued to recess the metal further into each recess and separate the cells through the memory hole, in some embodiments method 400 may include a secondary etch process to fully separate the cells and etch laterally within the recesses. Because memory holes may be extending to several micrometers in depth, etchants may lose energy flowing deeper into the structure, and laterally into the recessed features, which may further slow etching, and potentially lower selectivity to the exposed surfaces of the dielectric materials exposed on several sides. Accordingly, in a second operation the etchant may be adjusted to perform a second recess operation.

Figure 5C:
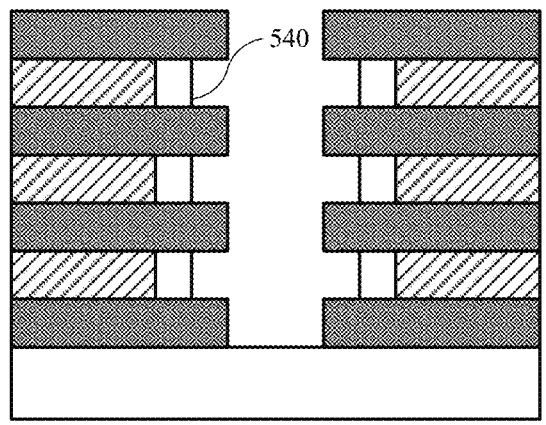

For example, the processing region may or may not be purged subsequent the first etching operation. A plasma may then be formed of an oxygen-containing precursor at optional operation 420, and flowed to the substrate. Again, the plasma may be formed in a remote portion of the processing chamber, or formed locally at the substrate level. At optional operation 425, the exposed metal, which has been previously opened in the first etch process, may be contacted with the plasma effluents of the oxygen-containing precursor. After the metal has been oxidized, a second fluorine-containing precursor may be flowed into the processing chamber at optional operation 430. In some embodiments the plasma may be extinguished prior to delivery of the second fluorine-containing precursor, and the processing chamber may be maintained plasma free during the delivery of the second fluorine-containing precursor. The second fluorine-containing precursor may be the same or different from the first fluorine-containing precursor, although in some embodiments the second precursor may more readily donate fluorine under process conditions. The second fluorine-containing precursor may contact the oxidized material, and may remove the oxidized metal at optional operation 435. As shown in FIG. 5C, the metal 540 may be fully separated between cells, and may be recessed within the access locations along the vertical memory hole.

In some embodiments residual fluorine may be incorporated in the remaining metal either after the first etch process and/or the second etch process. Accordingly, in some embodiments a post treatment operation may be performed at optional operation 440, which may occur subsequent the first etch process, such as after operation 415, subsequent the second etch process, such as at operation 440, or after each etch process. For example, a chlorine-containing precursor, such as boron trichloride, may be flowed into the processing chamber. The chlorine-containing precursor may or may not be plasma enhanced in embodiments, and if plasma enhanced, the plasma may be generated remotely or in situ within the processing chamber. The chlorine-containing precursor may contact the substrate, and may interact with the surface of the metal remaining to scavenge any residual fluorine in some embodiments of the present technology.

Exemplary fluorine-containing precursors may include one or more of fluorine or chlorine in some embodiments, as well as any other halogen. Some exemplary precursors that may be utilized may include halides including hydrogen fluoride, nitrogen trifluoride, or any organofluoride, diatomic fluorine, bromine trifluoride, chlorine trifluoride, sulfur hexafluoride, xenon difluoride, boron trichloride, tungsten pentachloride, tungsten hexachloride, or any other fluorine-containing precursor. A chlorine-containing precursor may be included or substituted for a fluorine-containing precursor as well, and boron trichloride, diatomic chlorine, or other chlorine-containing precursors may be used. The precursors may also be flown together in a variety of combinations. For example, as noted previously the second fluorine-containing precursor may more readily donate fluorine relative to the first fluorine-containing precursor. As one non-limiting example of precursors, the first fluorine-containing precursor may be or include nitrogen trifluoride, while the second fluorine-containing precursor may be or include tungsten hexafluoride or sulfur hexafluoride.

The precursors may also be flowed with any number of additional precursors or carrier gases including diatomic hydrogen, or a hydrogen-containing precursor, nitrogen, argon, helium, or any number of additional materials, although in some embodiments the precursors may be limited to control side reactions or other aspects that may impact selectivity. The secondary gas provided during the etch process may include oxygen-containing precursors and/ or nitrogen-containing precursors. For example, non-limiting oxygen-containing precursors may include diatomic oxygen, ozone, water, an alcohol, hydrogen peroxide, nitrous oxide, nitric oxide, or any other oxygen-containing material. Non-limiting nitrogen-containing precursors may include diatomic nitrogen, or any oxygen-containing precursor that also includes nitrogen, for example.

Process conditions may also impact the operations performed in method 400. Each of the operations of method 400 may be performed during a constant temperature in embodiments, while in some embodiments the temperature may be adjusted during different operations. For example, the substrate, pedestal, or chamber temperature during method 400 may be maintained at greater than or about 150° C., greater than or about 200° C., greater than or about 250° C., greater than or about 300° C., greater than or about 350° C., greater than or about 400° C., greater than or about 450° C., greater than or about 500° C., or higher. However, at higher temperatures, further dissociation of the fluorine-containing materials may occur, which may produce more fluorine radicals. As the amount of fluorine radicals increases, the protective gas may be incapable of controlling the reaction sufficiently. Accordingly, in some embodiments the temperature may be maintained below or about 700° C., and may be maintained below or about 650° C., below or about 600° C., below or about 550° C., below or about 500° C., or less.

In some embodiments, the process may occur at a variety of pressures, which may facilitate operations in any of a number of process chambers. For example, the process may be performed within chambers capable of providing pressures that may be maintained at greater than or about 1 Torr, and may be maintained at greater than or about 2 Torr, greater than or about 5 Torr, greater than or about 10 Torr, greater than or about 50 Torr, greater than or about 100 Torr, greater than or about 200 Torr, or higher. By utilizing pressures of greater than or about 1 Torr, delivery of etchants through high aspect-ratio structures may be facilitated. Although plasma may be utilized in one or more operations as noted above, in some embodiments plasma may not be used, and the entire method may be performed while maintaining a plasma-free environment within the semiconductor processing chamber. When plasma effluents are utilized during one or more of the operations, plasma power may be maintained at less than about 500 W. By maintaining a lower plasma power, sputtering may be controlled, and interactions may be limited to more controlled chemical reactions, which may better limit the extent of etching through the metal, such as nearer the top of the structure. This may further facilitate control of the profile along the memory hole, for example. Consequently, in some embodiments the plasma power may be maintained at less than or about 450 W, less than or about 400 W, less than or about 350 W, less than or about 300 W, less than or about 250 W, less than or about 200 W, less than or about 150 W, less than or about 100 W, or less.

By utilizing precursors and processing as discussed throughout the present technology, metal used in 3D NAND and other semiconductor structures may be more uniformly etched from between sections of dielectric material, such as silicon oxide, while limiting the damage or removal of silicon oxide, and maintaining improved profile or top-to-bottom loading value. For example, in some embodiments of the present technology, either after the first etch process or the second, a top-to-bottom loading value may be maintained at less than or about 2:1, and may be maintained at less than or about 1.8:1, less than or about 1.6:1, less than or about 1.5:1, less than or about 1.4:1, less than or about 1.3:1, less than or about 1.2:1, less than or about 1.1:1, or about 1.0:1, indicating an equivalent etch at locations nearer the top of the structure as well as nearer the bottom of the structure. By using the term "about", the present disclosure intends to encompass the limitations of measurement at form factors discussed throughout the present technology, which may not provide perfect precision in measurement, although the generally identified conditions are understood. Additionally, in some embodiments, the etch processes may be further tuned as noted above to produce either a V-shaped profile, or an inverted V-shaped profile, in which a top-to-bottom loading value may be maintained at less than or about 0.9:1, and may be maintained at less than or about 0.8:1, less than or about 0.7:1, less than or about 0.6:1, less than or about 0.5:1, or less.

In the preceding description, for the purposes of explanation, numerous details have been set forth in order to provide an understanding of various embodiments of the present technology. It will be apparent to one skilled in the art, however, that certain embodiments may be practiced without some of these details, or with additional details.

Having disclosed several embodiments, it will be recognized by those of skill in the art that various modifications, alternative constructions, and equivalents may be used without departing from the spirit of the embodiments. Additionally, a number of well-known processes and elements have not been described in order to avoid unnecessarily obscuring the present technology. Accordingly, the above description should not be taken as limiting the scope of the technology. Additionally, methods or processes may be described as sequential or in steps, but it is to be understood that the operations may be performed concurrently, or in different orders than listed.

Where a range of values is provided, it is understood that each intervening value, to the smallest fraction of the unit of the lower limit, unless the context clearly dictates otherwise, between the upper and lower limits of that range is also specifically disclosed. Any narrower range between any stated values or unstated intervening values in a stated range and any other stated or intervening value in that stated range is encompassed. The upper and lower limits of those smaller ranges may independently be included or excluded in the range, and each range where either, neither, or both limits are included in the smaller ranges is also encompassed within the technology, subject to any specifically excluded limit in the stated range. Where the stated range includes one or both of the limits, ranges excluding either or both of those included limits are also included.

As used herein and in the appended claims, the singular forms "a", "an", and "the" include plural references unless the context clearly dictates otherwise. Thus, for example, reference to "a precursor" includes a plurality of such precursors, and reference to "the layer" includes reference to one or more layers and equivalents thereof known to those skilled in the art, and so forth.

Also, the words "comprise(s)", "comprising", "contain(s)", "containing", "include(s)", and "including", when used in this specification and in the following claims, are intended to specify the presence of stated features, integers, components, or operations, but they do not preclude the presence or addition of one or more other features, integers, components, operations, acts, or groups.

The invention claimed is:

1. A method of etching comprising:
   flowing a fluorine-containing precursor and a secondary gas into a processing region of a semiconductor processing chamber, wherein the secondary gas comprises oxygen or nitrogen, and wherein a flow rate ratio of the fluorine-containing precursor to the secondary gas is greater than or about 1.2:1;
   contacting a substrate with the fluorine-containing precursor and the secondary gas, wherein the substrate defines a high aspect-ratio structure, wherein the high-aspect ratio structure is characterized by an aspect ratio of greater than or about 10:1, and wherein the substrate comprises an exposed metal within the high aspect-ratio structure; and
   etching the exposed metal within the high aspect-ratio structure, wherein the method is performed at a chamber operating pressure of between about 1 Torr and about 50 Torr.

2. The method of etching of claim 1, further comprising:
   forming a plasma of the fluorine-containing precursor and the secondary gas.

3. The method of etching of claim 1, wherein a temperature within the processing region is maintained at less than or about 500° C.

4. The method of etching of claim 1, wherein the high aspect-ratio structure comprises a memory hole in a 3D NAND structure, and wherein the exposed metal extends laterally into recesses formed perpendicular to a depth of the memory hole.

5. The method of etching of claim 1, further comprising:
   subsequent etching the exposed metal, purging the processing region of the semiconductor processing chamber;
   forming a plasma of an oxygen-containing precursor; and
   contacting the exposed metal with plasma effluents of the oxygen-containing precursor to produce oxidized metal.

6. The method of etching of claim 5, wherein the fluorine-containing precursor is a first fluorine-containing precursor, the method further comprising:
   flowing a second fluorine-containing precursor into the processing region; and
   contacting the oxidized metal with the second fluorine-containing precursor.

7. The method of etching of claim 6, wherein the processing region is maintained plasma free while contacting the oxidized metal with the second fluorine-containing precursor.

8. The method of etching of claim 1, further comprising:
   subsequent etching the exposed metal, flowing a chlorine-containing precursor into the processing region, wherein the chlorine-containing precursor scavenges residual fluorine.

9. The method of etching of claim 1, wherein a top-to-bottom loading value is less than or about 1.5 subsequent etching the exposed metal within the high aspect-ratio structure.

10. A method of etching comprising:
    flowing a first fluorine-containing precursor and a secondary gas into a processing region of a semiconductor processing chamber;
    contacting a substrate with the first fluorine-containing precursor and the secondary gas, wherein the substrate defines a memory hole in a 3D NAND structure, wherein the memory hole is characterized by an aspect ratio of greater than or about 10:1, and wherein the substrate comprises an exposed metal extending laterally into recesses formed perpendicular to a depth of the memory hole;
    etching the exposed metal within the memory hole;
    forming a plasma of an oxygen-containing precursor;
    contacting the exposed metal with plasma effluents of the oxygen-containing precursor to produce oxidized metal;

flowing a second fluorine-containing precursor into the processing region of the semiconductor processing chamber; and removing the oxidized metal, wherein a temperature within the semiconductor processing chamber is maintained between about 200° C. and about 500° C.

11. The method of etching of claim 10, wherein the secondary gas comprises oxygen or nitrogen.

12. The method of etching of claim 10, wherein a flow rate ratio of the first fluorine-containing precursor to the secondary gas is greater than or about 1:1.

13. The method of etching of claim 10, further comprising:
forming a plasma of the first fluorine-containing precursor and the secondary gas.

14. The method of etching of claim 10, wherein a pressure within the semiconductor processing chamber is maintained between about 1 Torr and about 50 Torr.

15. The method of etching of claim 10, wherein the processing region is maintained plasma free while flowing a second fluorine-containing precursor into the processing region of the semiconductor processing chamber.

16. The method of etching of claim 10, further comprising:
subsequent etching the exposed metal, flowing a chlorine-containing precursor into the processing region.

17. The method of etching of claim 16, wherein the chlorine-containing precursor scavenges residual fluorine from the exposed metal.

18. A method of etching comprising:
flowing a first fluorine-containing precursor and a secondary gas into a processing region of a semiconductor processing chamber, wherein the secondary gas comprises oxygen or nitrogen;

contacting a substrate with the first fluorine-containing precursor and the secondary gas, wherein the substrate defines a high aspect-ratio structure, wherein the high-aspect ratio structure is characterized by an aspect ratio of greater than or about 10:1, and wherein the substrate comprises an exposed metal within the high aspect-ratio structure;

etching the exposed metal within the high aspect-ratio structure;

contacting the exposed metal with an oxygen-containing precursor to produce oxidized metal;

flowing a second fluorine-containing precursor into the processing region of the semiconductor processing chamber; and removing the oxidized metal, wherein the method is performed with a chamber operating temperature of greater than or about 150° C. to less than or about 500° C.

* * * * *